United States Patent [19]

Sumner et al.

[11] 4,382,285

[45] May 3, 1983

[54] FILTER FOR BINARY DATA WITH INTEGRAL OUTPUT AMPLITUDE MULTIPLIER

[75] Inventors: Terence E. Sumner, Roselle, Ill.; James Ward, Mesa, Ariz.; Alan L. Wilson, Schaumburg, Ill.

[73] Assignee: Motorola, Inc., Schaumburg, Ill.

[21] Appl. No.: 221,188

[22] Filed: Dec. 30, 1980

[51] Int. Cl.³ .............................. G06F 15/34; 333 166
[52] U.S. Cl. ................................................. 364/724
[58] Field of Search ................. 364/724, 825; 328/167

[56] References Cited

U.S. PATENT DOCUMENTS

| | | | |
|---|---|---|---|
| Re. 28,638 | 12/1975 | Gibson | 325/323 |
| 3,543,009 | 11/1970 | Voelcker, Jr. | 364/724 |
| 3,633,170 | 1/1972 | Jones, Jr. | 364/724 |
| 3,694,752 | 9/1972 | Gibson | 325/323 |
| 3,753,115 | 8/1973 | Van Gerwen et al. | 325/323 |
| 3,801,934 | 4/1974 | Van Gerwen | 333/166 |
| 3,825,831 | 7/1974 | Ishiguro | 325/38 B |
| 4,012,628 | 3/1977 | Gersho | 235/156 |
| 4,044,306 | 8/1977 | Villeret et al. | 325/38 B |
| 4,149,259 | 4/1979 | Kowalski | 364/724 |
| 4,151,517 | 4/1979 | Kelley | 340/347 C |
| 4,233,684 | 11/1980 | Eggermont | 375/30 |
| 4,323,864 | 4/1982 | Ogawa et al. | 364/724 X |

OTHER PUBLICATIONS

Lockhart, "Digital Encoding and Filtering Using Delta Modulation", *The Radio & Electronic Engineer*, vol. 42, No. 12, Dec. 1972, pp. 547-551.

Wing, "Digital Filters Using Delta Modulation", *Proceedings of the IREE Aust*, vol. 40, No. 2, Mar. 1979, pp. 48-52.

IBM Technicala Disclosure Bulletin, vol. 16, No. 1, 1973, Riso et al.

IBM Technical Disclosure Bulletin, vol. 16, No. 12, May 1974, Nussbaumer.

IBM Technical Disclosure Bulletin, vol. 17, No. 3, Aug. 1974, Desblache.

IBM Technical Disclosure Bulletin, vol. 19, No. 5, Oct. 1976, Nussbaumer.

*Primary Examiner*—David H. Malzahn
*Attorney, Agent, or Firm*—John H. Moore; James W. Gillman; Edward M. Roney

[57] ABSTRACT

A filter for digital data comprises a plurality of cascaded latches clocked to form a plurality of flip-flops. A series-parallel network of resistors connected to outputs of the latches renders the circuit a filter that can be constructed with a limited resistance ratio. A plurality of switches connected to outputs of the flip-flops and operated by those outputs effects both filtering and multiplication by a voltage that is switched into the resistive network by the switches.

4 Claims, 4 Drawing Figures

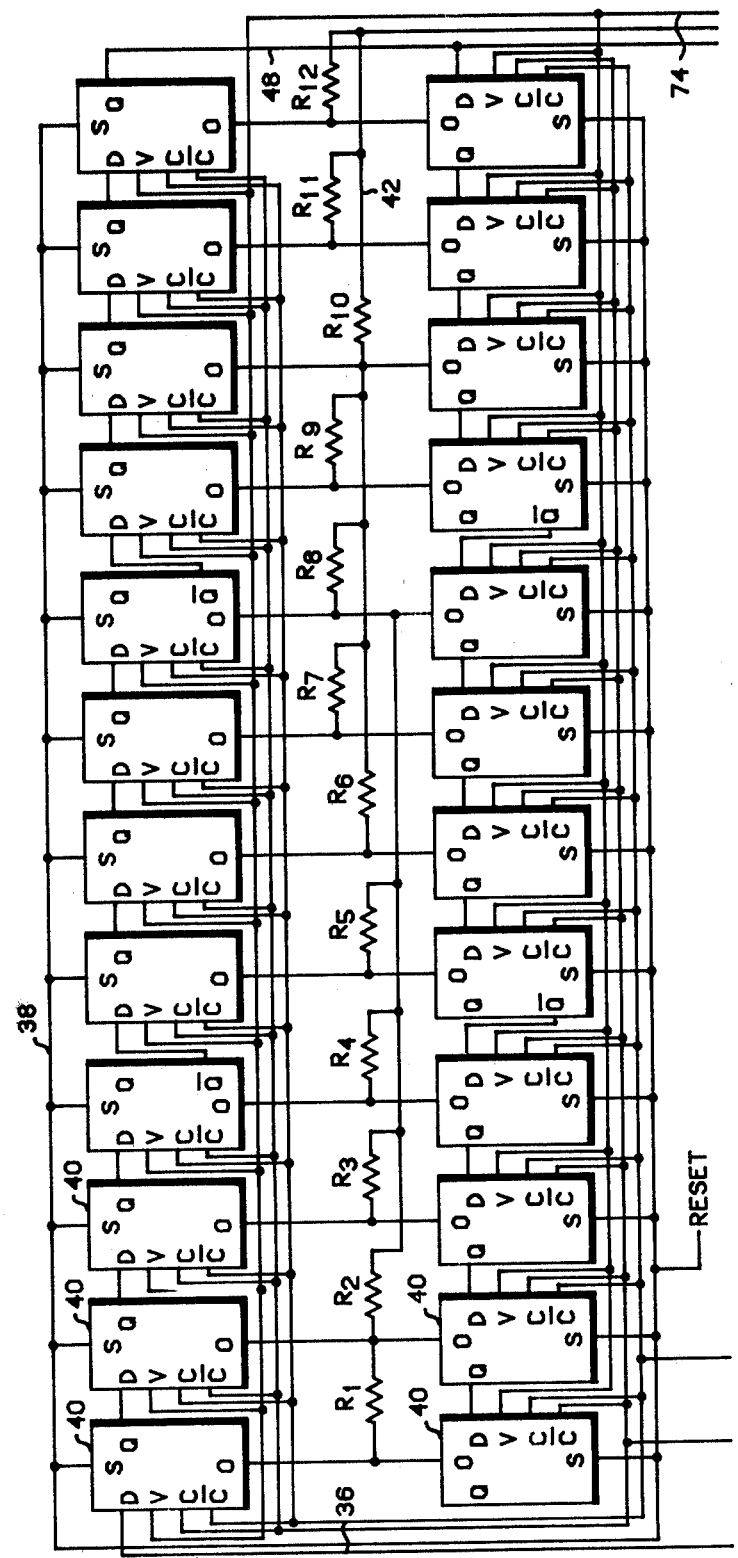

FILTER FOR BINARY DATA WITH INTEGRAL OUTPUT AMPLITUDE MULTIPLIER

BACKGROUND OF THE INVENTION

This invention is related to filters for digital data.

A data filter is a device that processes a stream of bits to achieve a desired transfer function. The commonest realization of a data filter is a shift register that is formed by cascading a plurality of elements that produce equal time delays. A resistor is connected to each such element at an output terminal. The other ends of all the resistors are tied together at a central point which is the output of the data filter. Well-known techniques of design allow a designer to select a desired number of stages in the shift register, the sign of the output at each stage of the shift register, and the magnitude of each of the resistors to achieve a desired transfer function. When so designed, such a filter is non-recursive. This means that its output is a function only of the input, and not of the previous output.

Data filters are of particular use for two applications in digital radio communications systems. One such use is a splatter filter for digital data. Another is to recover audio in a receiver for a continuously-variable-slope delta modulation (CVSD) system. A splatter filter is a low-pass filter that is so named because its purpose is to attenuate frequency components above an upper limit in a digital data stream, thus preventing the radio signal that is modulated with such data stream from "splattering" or spilling signal into adjacent channels. In the CVSD receiver, a data filter is useful for removing components at the bit rate that arise when recovering audio from a bit stream having CVSD modulation.

An analog filter could be used for either of these applications. However, a low-pass analog filter with a cutoff in the vicinity of 3 kHz requires element values that are difficult to obtain as a portion of an integrated circuit. In addition, if a circuit is otherwise adapted for realization in an integrated circuit, it is a relatively simple matter to increase the number of stages as desired to obtain a cutoff characteristic for a filter that is sharper than one easily obtainable with the discrete resistors, capacitors and inductors that are interconnected to form analog filters. It is particularly desirable in a splatter filter to have a sharp cutoff with a minimum amount of rolloff in the passband of the filter. This minimizes the delay or distortion of high-frequency information in the digital signal while enabling the designer to meet specifications for a maximum of allowable amount of adjacent-channel interference. Filters are used conventionally in CVSD systems in the conversion of the digital CVSD signal into audio. In the typical CVSD system a CVSD data stream is multiplied by an analog voltage to convert the data into a stream of bits that has pulse-amplitude modulation. This signal in turn is subjected to analog filtering to reconstruct the audio signal. This filter needs a low-pass characteristic in order to pass the reconstructed audio while removing both quantizing noise at the bit rate and aliasing noise that results from a spectral shift caused by the digitizing process. Aliasing places multiples of the fundamental audio spectrum periodically in frequency outside the passband. As with the splatter filter, the discrete resistors, inductors and capacitors that may be used to construct an analog filter for a CVSD receiver are difficult to achieve by the techniques used to obtain large-scale integrated circuits. With both the splatter filter and the CVSD filter, it would be desirable to have filters that could be realized as integrated circuits on semiconductor substrates.

In CVSD circuits that use analog low-pass filters to process the output of the CVSD multiplier, there is no effective way to combine multiplication and filtering and no reason for doing so. The application of a linear filter to a bit stream that has been subjected to pulse-amplitude modulation is a linear process that is cascaded with the CVSD modulator to form a CVSD receiver. If it were possible to combine filtering and multiplication, the result would be to minimize components and improve the effectiveness of the circuit.

It is an object of the present invention to provide an improved data filter.

It is a further object of the present invention to provide a multiplying data filter.

It is a further object of the present invention to provide a data splatter filter.

It is a further object of the present invention to provide a data splatter filter that is adapted for construction as an integrated circuit.

It is a further object of the present invention to provide a multiplying data filter that is adapted for construction as an integrated circuit.

SUMMARY OF THE INVENTION

A multiplying digital filter comprises a plurality of cascaded flip-flops, each of which has outputs that are connected to control electronic switches. Each switch applies one or another of two voltages to one terminal of a resistor. The other terminal of each such resistor is connected to a network that includes a central point which is the output of the circuit. When a pulse train is applied to the cascade of flip-flops, the result is to combine multiplication of the applied voltage with digital filtering of the signal applied to the first flip-flop. In one embodiment of the invention, one voltage that is applied to the resistor is zero in that the resistor is connected to ground. The other voltage is the output of the syllabic filter in a CVSD receiver. The output of this combination is the filtered product of the digital bit stream and the syllabic voltage. In another embodiment where the input voltage is maintained constant in time, the filter is adaptable for such uses as a splatter filter.

BRIEF DESCRIPTION OF THE DRAWINGS

FIGS. 2A and 2B form a detailed schematic diagram of a multiplying digital filter as used in the circuit.

DETAILED DESCRIPTION OF THE INVENTION

Figure 1:
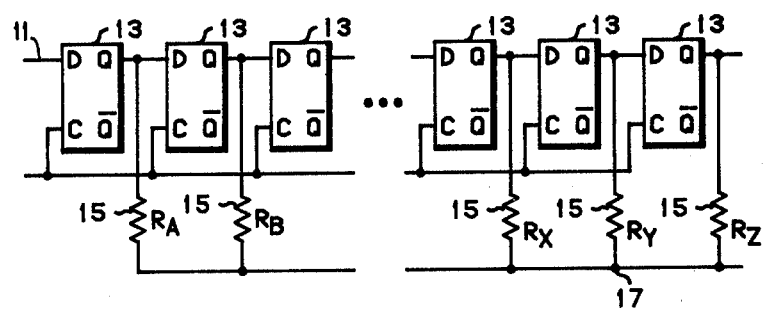
FIG. 1 is a schematic diagram of a typical digital filter.

FIG. 1 is a schematic diagram of a typical data filter. In FIG. 1, a string of digital pulses is to be applied at terminal 11 which is connected to the D input of the first of a cascaded string of flip-flops 13. The flip-flops 13 are all clocked by a clocking input which is at a frequency equal to or greater than the frequency of the digital input at terminal 11. In FIG. 1, the Q output of each flip-flop 13 is connected to one end of a resistor 15, the other end of which is tied to terminal 17. Each resistor 15 in FIG. 1 is designated as $R_A$, $R_B$, etc. to indicate that their values will in general be different. Both the values of the resistor 15 and the algebraic sign associated with their position in the circuit is determined by applying well-known rules of filter design. The circuit of FIG. 1 shows the results of a design in which all filter signs are positive. If a particular position in the filter of FIG. 1 called for a negative sign, then the $\overline{Q}$ output of that flip-flop 13 would be taken as the output for connection to the appropriate resistor 15. When the appropriate number of flip-flops 13 has been cascaded, the output of the filter is produced at terminal 17.

Figure 3:
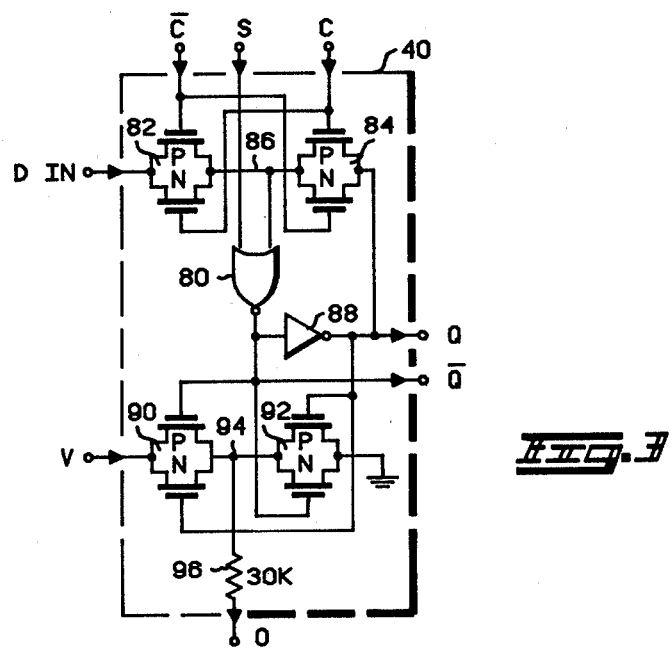
FIG. 3 is a circuit diagram of a flip-flop of FIG. 2.
Figure 2B:
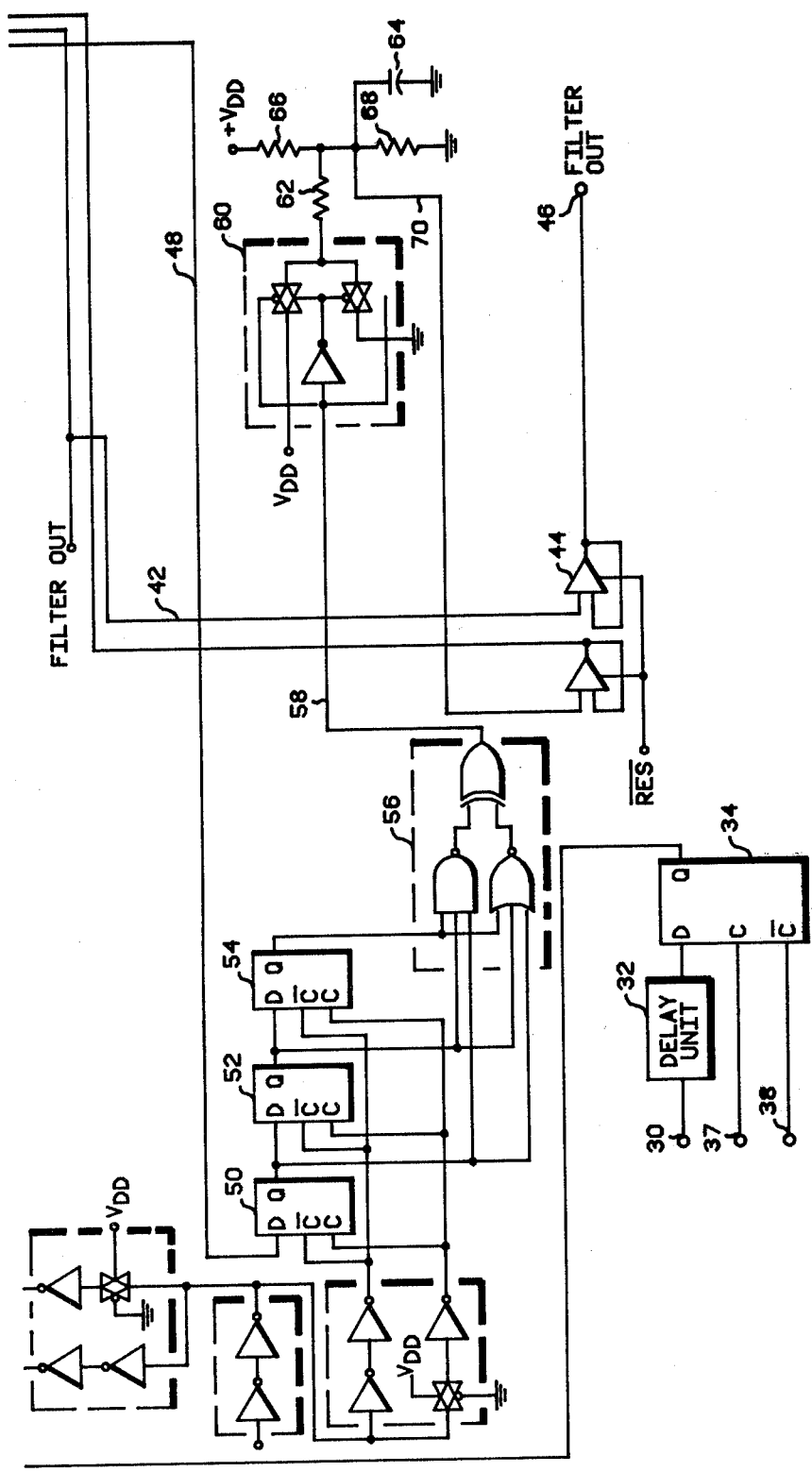

FIGS. 2 and 3 are detailed circuit schematics of an embodiment of a multiplying digital filter that has been used in constructing an integrated circuit using complementary metal-oxide semiconductors (CMOS). FIGS. 2A and 2B form the multiplying data filter with a symbolic representation of flip-flops, and FIG. 3 is a circuit diagram of the flip-flops of FIG. 2. In FIGS. 2 and 3, a train of pulses, properly shaped if necessary by reclocking flip-flop 34, is conducted on line 36 to digital filter 38. Digital filter 38 comprises a number (in this case, 24) of flip-flops 40 connected in cascade to form a shift register. The output (here denoted "O") of the first flip-flop 40 is connected to the corresponding terminal of the last; that of the second, to the next-to-last, and so on. In the usual implementation of a digital filter, each of the common points thus formed is connected through a resistor to an output terminal of the filter as in FIG. 1. That connection is modified in digital filter 38, and the resistors, denoted $R_1$ through $R_{12}$, are in a combination that is calculated to minimize the percentage variation in resistor values. This makes it easier to form resistors $R_1$ through $R_{12}$ on a semiconductor substrate using techniques of integrated circuits. Values of these resistors in the digital filter 38 as constructed are listed in Table I.

TABLE I

| Values of Resistors in Digital Filter 38 | |
|---|---|
| Resistor Number | Resistance in Kilohms |
| 1 | 49.65 |
| 2 | 101.36 |
| 3 | 70.4 |
| 4 | 108 |
| 5 | 56.72 |
| 6 | 95.04 |
| 7 | 55.2 |
| 8 | 54.96 |
| 9 | 62.16 |
| 10 | 63.76 |
| 11 | 64.32 |
| 12 | 44.96 |

In typical data filters, the voltage at the output terminal O is taken at the Q or $\overline{Q}$ terminal of each of the flip-flops 40. This means that in the conventional data filter, the voltage applied at the flip-flop end of each of the resistors $R_1$ through $R_{12}$ can take on one of two values. However, in the flip-flops 40 of FIG. 2, terminal O is switched alternately to the voltage at terminal V or to ground. This effects the multiplication that makes data filter 38 a multiplying filter. This feature will be described further in an examination of the details of the flip-flop 40 in FIG. 3. However, one feature of the invention is apparent in FIG. 2. This is the combination of the resistors, mentioned above. Table I shows that the lowest tabulated value of resistance, 44.96 Kilohms, and the largest, 108 Kilohms, are within a factor of 2.5 of each other. This fact makes it easier to construct the digital filter of FIG. 2 in CMOS. The combination is achieved by taking the resistor values that result from conventional techniques of filter design and subjecting them to repeated wye-delta transformations. This may be done equally as well with the filter tap weights, which are the values of the tap conductances. Each transformation to a wye generates an extra node that can be connected to other nodes to reduce resistor values or can be split to increase resistor values. The resulting increase in the number of resistors is of minor concern in CMOS technology, while the reduction in resistance ratio makes CMOS design easier. The resistance ratio is here defined as the ratio of the highest value of resistance to the lowest for resistors in the network.

FIG. 3 is a gate realization of a flip-flop 40 of FIG. 2. The term "flip-flop" has been used because the circuit of FIG. 3 includes the functions of conventional flip-flops, but it will become apparent from the description of the circuit of FIG. 3 that the circuit performs additional functions. The circuit of FIG. 3 is a latch that operates a switch. As such, it is half a flip-flop. When two such circuits are cascaded and clocked oppositely, they comprise a single flip-flop that operates two switches. This is a particularly effective way to form flip-flops in CMOS technology. Referring to FIG. 3, an S input is taken as one input to NOR gate 80. This is a set terminal to enable or disable operation of the circuit. Terminals C and $\overline{C}$ are respectively clock and anticlock inputs. Each is connected to transmission gates 82 and 84. Common point 86 of transmission gates 82 and 84 is connected as an input to NOR gate 80, the output of which is taken to terminal $\overline{Q}$ and through inverter 88 to terminal Q. The output of inverter 88 is also connected as an input to transmission gate 84 so that the combination of transmission gates 82 and 84 and inverter 88 comprise a half flip-flop, enabled by NOR gate 80. This circuit is rendered effectively a full flip-flop because of the combined clock and anticlock inputs. Both the Q and $\overline{Q}$ outputs are connected internally to a second set of transmission gates 90 and 92. A common point 94 of transmission gates 90 and 92 is taken through a resistor 96 to output terminal O. When transmission gate 90 is caused by a positive $\overline{Q}$ signal or a negative Q signal to conduct the voltage V is applied through resistor 96 to output terminal O. Conversely, when transmission gate 92 is caused by a positive Q signal or a negative $\overline{Q}$ signal to conduct, common point 94 is connected to ground, and thus resistor 96 is grounded. The logical operation of the circuit of FIG. 3 will become more apparent upon an examination of the truth table for that circuit which is shown in Table II.

TABLE II

| Truth Table for Circuit of FIG. 3 | | | | |
|---|---|---|---|---|
| S | D | C | Q | O |
| 1 | — | — | 1 | GROUND |
| 0 | 0 | 0 | LATCH | UNCHANGED |
| 0 | 0 | 1 | 0 | GROUND |
| 0 | 1 | 0 | LATCH | UNCHANGED |
| 0 | 1 | 1 | 1 | V |

NOTES:
The bar (—) indicates a don't care condition; "LATCH" means Q holds its last previous value; "UNCHANGED" means output terminal O holds its last previous value.

The circuit of FIG. 3 has several differences from the standard data filter, which comprises successive time delays connected through resistors to the output. Well-known techniques are used to determine the number of stages of time delay and to calculate the values of the resistors to provide a desired amount of filtering. The calculational techniques will normally set the minimum desired number of stages to a shift register and establish the clock frequency. In some positions, the design calculations may call for negative signs in implementing the filter. This can be accomplished when the time delays are flip-flops by connecting the resistor that is in the position calling for a negative sign to a $\overline{Q}$ terminal rather than a Q terminal. Alternatively, the same result could be achieved for an individual flip-flop by driving that flip-flop from the $\overline{Q}$ terminal rather than the Q terminal. Such a change repeats the sign change in successive flip-flops. Either of these methods of connecting the shift register is a matter of design choice. The typical circuit presents three disadvantages that are overcome by the circuit of FIG. 3. First, resistors realized according to the calculational methods that are described in the reference can be expected to produce resistor values that differ in a ratio of 10:1 or more. Such resistance ratios are difficult to achieve in CMOS technology because of the substrate area required. An improvement in such a realization is shown in FIG. 3 in which resistors have been placed in series-parallel combinations to bring their spread of resistances to a factor of approximately 2:1.

A second improvement in the circuit of FIG. 3 results from the fact that the current supplied to the resistors of the typical data filter is the same current that operates the logical functions of the flip-flops. That current is typically enough to warrant using large transmission gates which tend to load the flip-flops appreciably. The circuit of FIG. 3 overcomes this disadvantage by separating the logical operation of the flip-flop from current handling. Referring to FIG. 3, the flip-flop comprises transmission gates 82 and 84, NOR gate 80 and inverter 88. However, neither the Q nor the $\overline{Q}$ terminal is used as an output to the resistors of a filter. Rather, the Q and $\overline{Q}$ terminals are taken to what is essentially a single-pole double-throw switch that is formed by FET gates 90 and 92. This switch allows the voltage V to supply whatever current is delivered through resistor 96 to the resistors $R_1$ through $R_{12}$ of FIG. 2.

The third feature of the circuit of FIGS. 2 and 3 that differs from the conventional digital filter is the use of a value of voltage V of FIG. 3 that varies within a limited range. In the circuit of FIG. 2, that variable voltage is taken as the output of a syllabic filter. By so switching the output voltage of the syllabic filter, the circuit of FIG. 2 acts as a combined digital filter and multiplier. This combines a digital filter and a multiplier to produce an output that is, when filtered, an audio reconstruction of a CVSD signal. The combination of multiplier and filter is disclosed and claimed in a copending application Ser. No. 221,189 filed Dec. 30, 1980, assigned to the assignee of the present invention.

Referring again to FIG. 2, it should be noted that each flip-flop 40 is connected both to a clock pulse (C) and an anticlock pulse ($\overline{C}$). Connections are alternated so that one flip-flop 40 is triggered by a clock pulse and the adjacent one is triggered by a $\overline{C}$ pulse. This doubles the apparent frequency of the operation of the filter of FIG. 2A.

We claim:
1. A multiplying filter for digital data comprising:
    a plurality of cascaded clocked latches, alternate latches of the plurality clocked oppositely so that pairs of adjacent latches form cascaded flip-flops;
    a plurality of voltage-operated switches, one of each of the switches connected to an output of one of the latches;
    a first voltage source connected to each of the plurality of switches and connected through upon a first signal from a latch;
    a second voltage source connected to each of the plurality of switches and connected through upon a second signal from a latch;
    a network of resistors, one of each of the resistors connected through one of the plurality of switches to one of the first and second voltage sources, the network having a central point that is an output of the filter.

2. The filter of claim 1 wherein the network of resistors comprises resistors of which the ratio of resistance of the largest resistor to the resistance of the smallest resistor is less than or equal to 2.5.

3. The filter of claim 1 wherein the voltage-operated switches are transmission gates.

4. The filter of claim 1 wherein the first voltage source is a time-varying voltage source and the second voltage source is zero volts.

* * * * *